United States Patent [19]

Babij et al.

[11] Patent Number: 4,588,993
[45] Date of Patent: May 13, 1986

[54] BROADBAND ISOTROPIC PROBE SYSTEM FOR SIMULTANEOUS MEASUREMENT OF COMPLEX E- AND H-FIELDS

[75] Inventors: Tadeusz M. Babij, Ft. Lauderdale, Fla.; Howard Bassen, N. Chevy Chase, Md.

[73] Assignee: The United States of America as represented by the Secretary of the Department of Health and Human Services, Washington, D.C.

[21] Appl. No.: 496,275

[22] Filed: May 19, 1983

Related U.S. Application Data

[63] Continuation-in-part of Ser. No. 210,584, Nov. 26, 1980, abandoned.

[51] Int. Cl.$^4$ .......................... G01S 3/02; G01R 31/02
[52] U.S. Cl. ..................................... 343/351; 343/703; 324/158 P; 324/72.5
[58] Field of Search ................ 343/351, 383, 703, 850, 343/853, 855, 866, 867, 893; 324/158 P, 72, 72.5

[56] References Cited

U.S. PATENT DOCUMENTS

| | | | |
|---|---|---|---|
| 2,256,619 | 9/1941 | Luck | 343/726 |
| 3,631,500 | 12/1971 | Itoh | 343/703 |
| 3,691,561 | 9/1972 | Jager | 343/727 |
| 3,718,932 | 2/1973 | Ikrath et al. | |
| 3,947,770 | 3/1976 | Cavanagh et al. | 343/703 |
| 4,023,093 | 5/1977 | Aslan | |

OTHER PUBLICATIONS

1975 IEEE Electromagnetic Compatability Symposium Record, EMC the Old and the New,-"Superwideband Electric Field Probes"-Babij.

*Primary Examiner*—Theodore M. Blum
*Assistant Examiner*—David Cain
*Attorney, Agent, or Firm*—Browdy and Neimark

[57] ABSTRACT

A broadband isotropic probe system simultaneously measuring the E- and H-field intensities of rf complex, near-field electromagnetic radiation comprises a set of three mutually orthogonal dipole antennas and a set of three mutually orthogonal loop antennas located within the same volume of space. Each antenna has associated circuitry comprising a frequency-response-shaping filter and diode detector to provide a frequency response which is flat over the desired frequency bandwidth. The lengths of the dipoles are kept electrically small so that the EM fields are not perturbed. The diameters of the loops are kept electrically small so that the E-field pickup will be negligible. Coupling between any of the probe's antennas is also minimized by the use of electrically small antennas. Circuit means based on the use of square law detectors is also provided, the circuit including an arrangement of analog or digital data processing portions leading into a display means and a data recorder.

22 Claims, 10 Drawing Figures

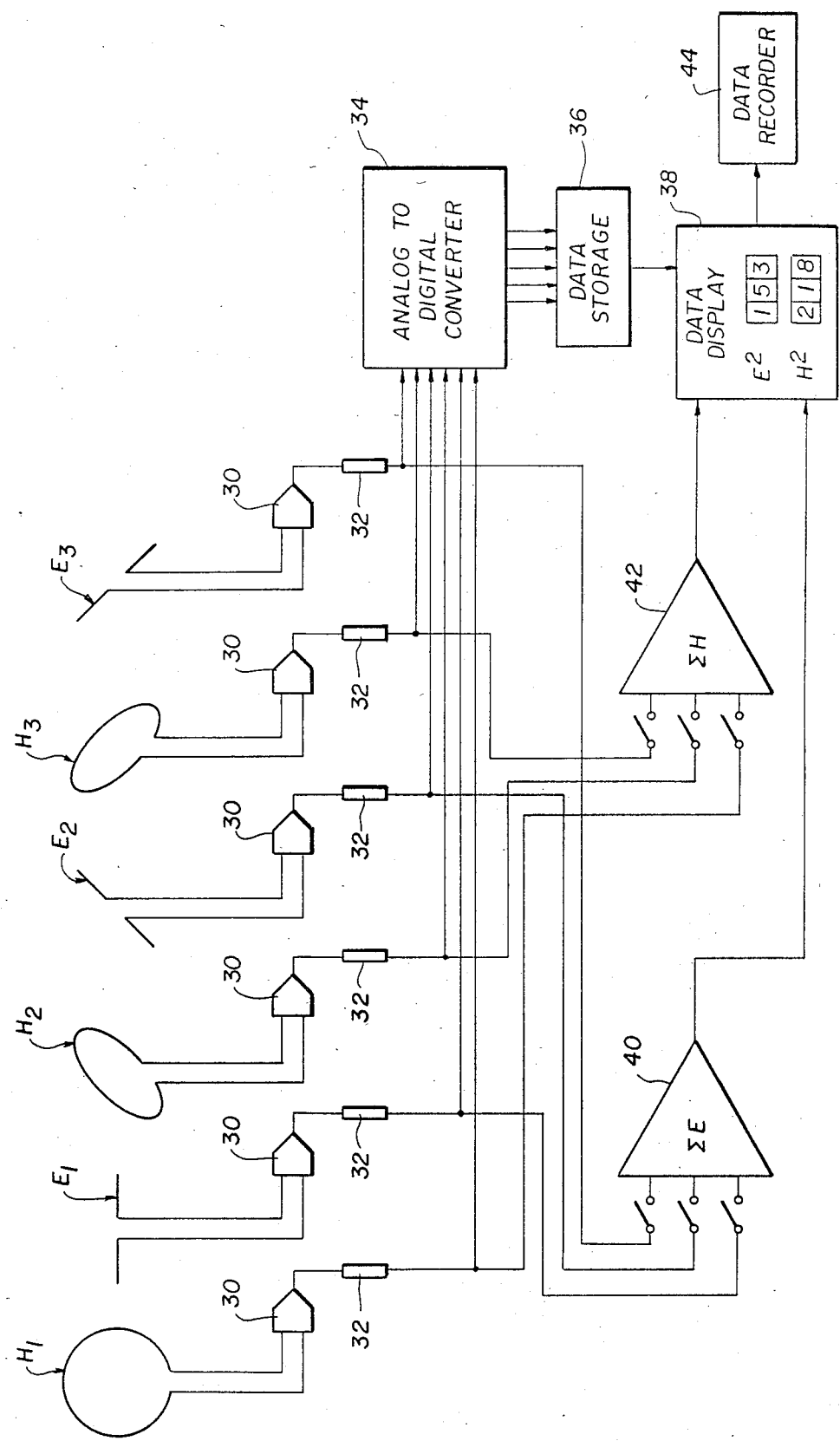

BROADBAND ISOTROPIC PROBE SYSTEM FOR SIMULTANEOUS MEASUREMENT OF COMPLEX E- AND H-FIELDS

REFERENCE TO RELATED APPLICATION

This application is a continuation-in-part of copending application Ser. No. 210,584, filed Nov. 26, 1980, now abandoned, the entire teaching of which is incorporated herewith by reference.

BACKGROUND OF THE INVENTION

The present invention relates to radiofrequency (rf) electromagnetic (EM) field measurements and especially to such measurements made simultaneously and in the same location (same volume of space).

Measurements of rf complex, near field electromagnetic radiation sources, are frequently made to determine the intensity of the electric and magnetic fields at a given location in close proximity to RF sources, the reasons for such measurements being to ascertain electromagnetic radiation hazards to human beings.

At one time, field measurements were made with directive antennas but it was found that these antennas do not reliably measure complicated EM fields, such as those with reactive near-field components, multipath reflections, arbitrary polarization, multiple frequency components, complicated modulations and large field gradients. The accuracy of isotropic probes is independent of polarization of the measured radiation and direction of propagation. Those probes with square-law detection characteristics and broad bandwith overcome the uncertainties created by the complex EM fields because the outputs of three orthogonal antennas (either loops or dipoles) can be summed to obtain the square of the magnitude of the total field.

Previous EM field measurement systems have utilized two probes, one to measure the E-field and one to measure the H-field. In the near field of a radiation source, the EM field changes very sharply per unit volume, i.e., a very small change in spatial position of a three-dimensional probe can result in a large change in measured field intensity. Also, under typical usage situations, potentially hazardous fields generated by industrial or medical devices change rapidly with time (energy is generated for a few seconds per minute in a random pattern). If it is desired to measure, in the same spot, electric and magnetic field strengths which vary spatially and temporally, one must place two separate probes in exactly the same place at the same time, a physical impossibility. Even if the two probes are placed closely together, they cannot measure the respective fields at exactly the same point (volume) in space.

Alternatively, the probes may be placed at the same spot if used sequentially in time. However, the field under study may vary in intensity over the finite interval of time which elapses between performance of each measurement. Hence, measurement uncertainty exists in that the fields may vary rapidly temporally and spatially.

SUMMARY OF THE INVENTION

Accordingly, an object of the present invention is to overcome deficiencies in the prior art, such as indicated above; another object is to provide more accurate radiation measurements.

A further object is to measure simultaneously the electric and magnetic field intensities of a complex EM field in the same volume of space.

Yet another object is to provide an EM field probe which is isotropic for both the magnetic and electric fields.

Yet a further object is to provide an EM field probe which has a flat response over the frequency band of interest.

Yet another object is to provide in the same volume of space a set of three orthogonal E-field antennas and a set of three orthogonal H-field antennas.

Still another object is to provide in the same volume of space a set of three orthogonal E-field antennas and a set of three orthogonal H-field antennas which do not significantly perturb each other's field.

A further object of the invention is to provide a circuit means for simultaneously measuring the total electric (E) and total magnetic (H) field intensities. The circuit includes individual square law detectors for each of the three orthogonal E-field antennas and each of the three orthogonal H-field antennas. The circuit also includes additional converters, amplifiers, data processing and storing means, display means and the like, necessary to accomplish this purpose.

These and other objects and advantages of the present invention are achieved by constructing a set of three orthogonal electric-field-measuring antennas and a set of three orthogonal magnetic-field-measuring antennas and effectively locating them so that they encompass the same volume of space. The operating characteristics of the antennas are controlled by filters so that the antennas provide a substantially flat response over a desired frequency range, and also by constructing the antennas small enough, with relation to the wavelength of the highest frequency to be received, so that the EM fields to be measured are not significantly disturbed and the receiving characteristics of all antennas are optimal.

BRIEF DESCRIPTION OF THE DRAWINGS

FIG. 6 is a overall schematic system diagram of the invention.

DETAILED DESCRIPTION OF ILLUSTRATIVE EMBODIMENTS

Figure 1A:
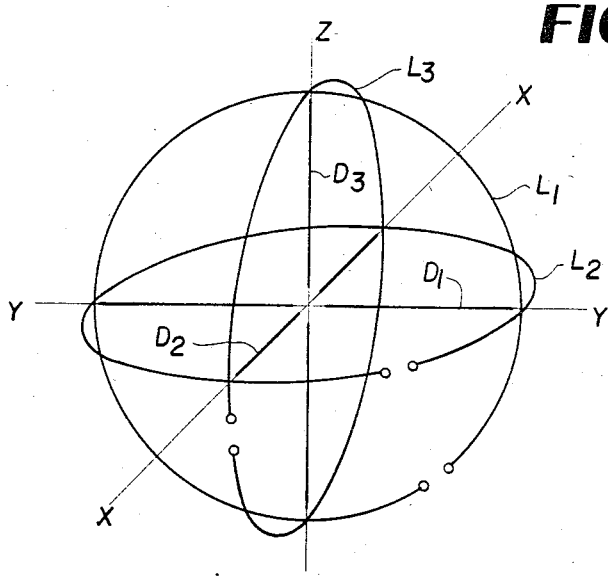
FIG. 1a is a schematic diagram showing a set of three mutually orthogonal dipoles and a set of three mutually orthogonal loop antennas covering the same spatial volume.

A set of three mutually perpendicular dipole antennas (E-field antennas) $D_1$, $D_2$ and $D_3$ and a set of three mutually perpendicular loop antennas (H-field antennas) $L_1$, $L_2$ and $L_3$ are shown in FIG. 1a. These antennas are effectively located in and cover, or encompass, the electromagnetic fields in the same volume of space, which space can be described in relation to an assumed set of Cartesian coordinate axes x, y and z. Thus, loop $L_1$ lies in the y-z plane
loop $L_2$ lies in the x-y plane
loop $L_3$ lies in the x-z plane
dipole $D_1$ lies on the y axis
dipole $D_2$ lies on the x axis
dipole $D_3$ lies on the z axis.

Figure 1B:
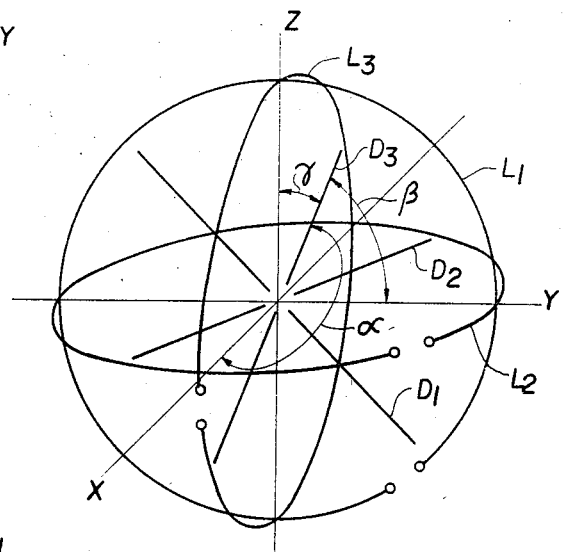
FIG. 1b is a schematic diagram showing how the set of dipoles of FIG. 1a may be rotated in their orientation relative to the set of loops to further reduce coupling between antennas.

The antennas may be rotated from exact alignment with their respective coordinate planes and axes, as shown in FIG. 1b, where the dipole antennas are so rotated. The direction cosines of the antennas should be equal. In the figure, $\alpha$ is the angle dipole $D_3$ forms with the x axis, $\beta$ is the angle dipole $D_3$ forms with the y axis, and $\gamma$ is the angle dipole $D_3$ forms with the z axis.

Figure 2A:
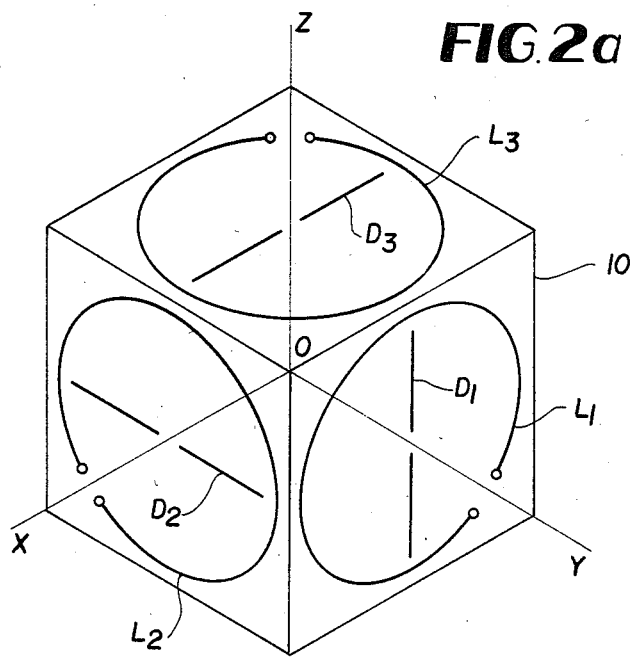
FIG. 2a is a schematic diagram showing a different arrangement of the three dipoles and three loops in a cubic configuration.
Figure 2B:
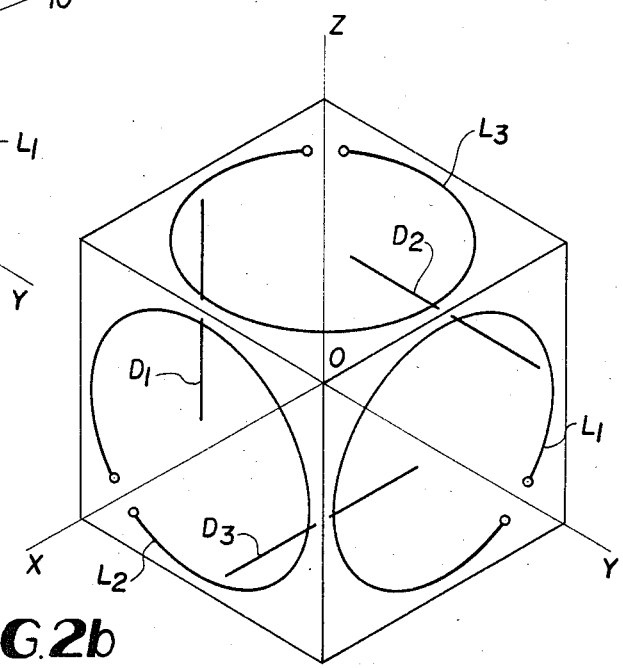
FIG. 2b is a schematic diagram showing a still different arrangement of the dipoles and loops in a cubic configuration to further reduce coupling between antennas.

Another scheme for placement of the antennas so that they cover the same volume is shown in FIG. 2a. Here the antennas are located on three walls of a cubic structure 10, $D_1$ and $L_1$ being placed on one wall, $D_2$ and $L_2$ on another, and $D_3$ and $L_3$ on a third. This arrangement can be varied as shown in FIG. 2b, for example. Here the dipoles and loops are placed on different walls to reduce coupling between any two antennas. Thus, $D_1$ is on an x-z plane wall at y=0
$D_2$ is on an y-z plane wall at x=0
$D_3$ is on an x-y plane wall at z=0
$L_1$ is on an x-z plane wall at y=1
$L_2$ is on an y-z plane wall at x=1
$L_3$ is on an x-y plane wall at z=1

Other antenna arrangements are possible.

Figure 3:
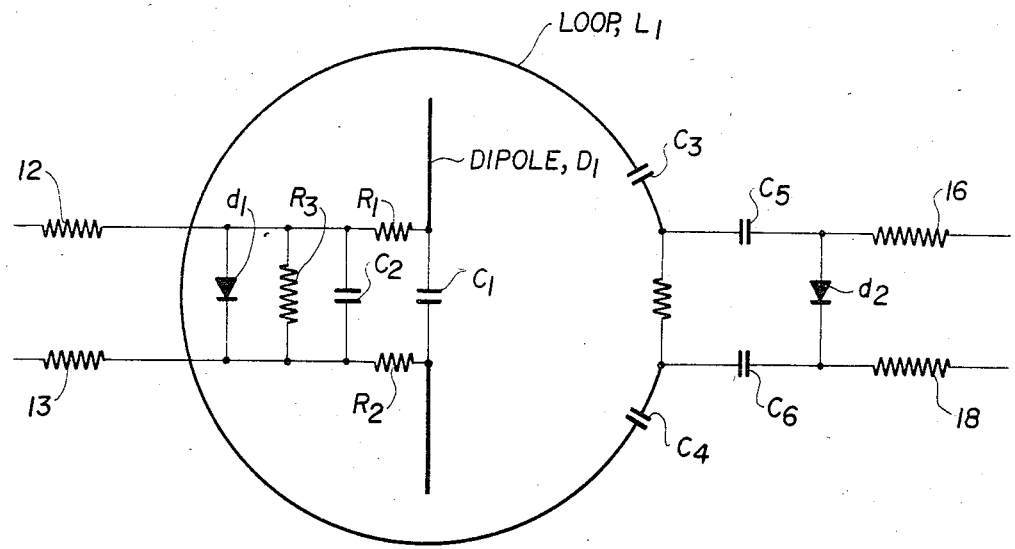
FIG. 3 is a schematic diagram showing a dipole and a loop antenna and the circuitry used to adjust the receiving characteristics of the antennas so that the response is flat over the frequency range of interest.

An important aspect of the present invention is to assure that the antennas are isotropic (so as to receive arbitrary field polarizations equally), substantially flat in frequency response over the frequency band of interest, and minimally, or insignificantly, perturb the complex near or far EM fields. This can be accomplished by using band-pass filters to shape the diode-detected signals relative to frequency and by utilizing antennas having a length equal to or less than one-tenth the wavelength of the highest frequency to be received. Also, the use of high-resistance leads to the antennas tends to prevent disturbance of the EM fields by the leads. Possible configurations for a dipole antenna $D_1$ and a loop antenna $L_1$ are shown in FIG. 3. A Schottky diode $d_1$ is placed across the gap in dipole $D_1$ and high-resistance leads 12 and 14 and are used to bring out the detected signal. The inherent source capacitance of the dipole and load resistance of the diode, respectively, form a high pass RC filter. Such filter arrangements are shown in U.S. Pat. Nos. 3,750,017 and 4,008,477. Also see "EM Probe with Fiber Optic Telemetry System", by Bassen, Herman and Hoss, published in Vol. 20, April 1977, Microwave Journal.

It is also possible to utilize resistors $R_1$, $R_2$, $R_3$ and capacitors $C_1$, $C_2$ to form the proper frequency shaping filter where inherent capacitive and resistive values of the antenna and diode are not of the proper value to provide desired filter characteristics.

The loop antenna also has a filter and diode arrangement with $C_3$, $C_4$, $C_5$ and $C_6$ and $R_4$ forming the filter, and Schottky diode $d_2$ across the loop antenna end of the high-resistance leads 16 and 18 performing the detection function.

In a test model in which the diameter of each loop antenna was 50 mm and the length of each dipole was 45 mm, both the loop and dipole antennas had a flat frequency response from 10 to 100 MHz within ±1 dB. The following component values would be typical for a 50 mm diameter loop antenna with a substantially flat response from 10-100 MHz:

$C_3$—20 nanofarads
$C_4$—20 nanofarads
$C_5$—20 nanofarads
$C_6$—20 nanofarads
$R_4$—5 ohms.

To minimize any possibility of the production of standing waves by the dipoles and loops, which would perturb the EM fields within the spatial volume of the probe and would interfere with the performance of the antennas, the length of the dipoles and the diameter of the loops are kept equal to or less than one-tenth of the wavelength of the highest frequency to be received by the probe.

Figure 4A:
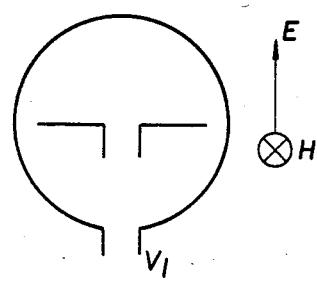
FIGS. 4a and 4b are schematic illustrations of orientations of a dipole and a loop with respect to the electromagnetic E- and H-field vectors where the loop pickup ratio of the two orientations is to be measured.
Figure 4B:
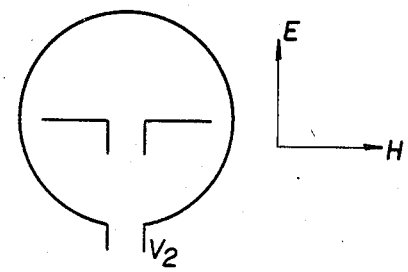
Figure 5A:
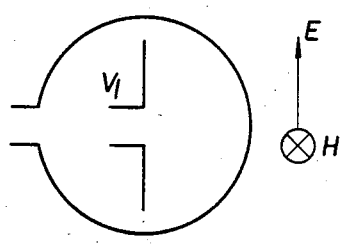
FIGS. 5a and 5b are schematic illustrations of orientations of a dipole and a loop with respect to the electromagnetic E- and H-field vectors where the dipole pickup ratio of the two orientations is to be measured.
Figure 5B:
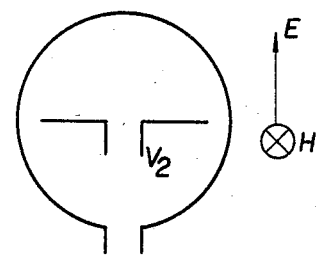

FIGS. 4 and 5 indicate various orientations of a dipole and a loop antenna, each lying in the same plane, with respect to the electromagnetic fields. In all cases, the E-field vector lies in the plane of the loop and its direction is upward in the figures. The H-field vector is either perpendicular to the plane of the loop with its direction into the paper away from the observer, or parallel to the plane of the loop. The E-field pickup ratio ($V_2/V_1$) of the loop (H-probe) for the antenna orientations of FIGS. 4a and 4b can be better than −13 dB with respect to H-field response. Dipole antenna pattern degradation (due to high-resistance-lead pickup and loop influence on the dipole) is determined by measuring a ratio $V_2/V_1$ (for the E-probe) of better than −25 dB can be obtained for the orientations shown in FIGS. 5a and 5b.

FIG. 6 shows an overall schematic circuit of the invention including the circuitry necessary to measure the three individual vector components of the total magnetic field intensity and the three individual vector components of the total electric field intensity, and to display these results separately.

The three sets of antennas are indicated by the legends $H_1$ through $H_3$ and $E_1$ through $E_3$, together with more or less conventional symbols for magnetic and electric field antennas. The difference in the orientation of the antennas is to indicate the mutual orthogonal arrangement of each set of antennas. Each antenna is associated with a square law detector circuit 30 and a signal conditioning means 32. The output of the signal conditioner 32 is passed on to an analog to digital converter 34, and from there onto a temporary data processing and storage means 36. Thereafter, the accumulated data is sent onto the data display 38. A permanent data recorder 44 can be associated with the system to record results permanently, as needed.

Alternatively, each set, that is the magnetic and electric field antennas, also have the results passed on from their signal conditioners 32 to respective summing amplifiers, an amplifier 40 for the electric field, and a similar amplifier 42 for the magnetic field. The lines from each respective antenna's associated signal conditioner are also controlled by a manual switch, one such switch, unnumbered, being provided in each of the input lines to each respective summing amplifier 40 or 42.

The summed outputs of the two summing amplifiers 40 and 42 are also fed into the main data display 38. A permanent data recorder 44 can be associated with the system to record results permanently, as needed.

The invention system is uniquely capable of simultaneous measurement of all the vector components of both the electric (E) and magnetic (H) fields existing at a single location, at a single instant in time, particularly where steep field gradients exist. This task can be performed with non-directional, electrically-small antennas and the signal processing circuitry described. The prior art for multiple antenna arrays containing both loop (magnetic field) and dipole (electric field) antennas utilized only electrically large, directional antennas, was without such circuitry to provide the vector sum of both the E and H fields. The present invention includes a total of six non-directional, electrically small antennas, all placed within a small volume of space which has dimensions much less than one wavelength of the electro-magnetic fields being measured.

The square law detectors for each of the three dipole (E) antennas and for each of the three loop antennas provide the squared value of the instantaneous amplitude of each received field vector component. The individual signal conditioners process the outputs of each detector's output voltage, and compensate for imperfections in the detector's squaring performance. All six of the conditioned signals are then sent to the digital signal processing system or alternatively to the analog electronic processing system. In the case of the analog electronic system, the two summing amplifiers 40 and 42 are employed to separately provide the sum of the three electric field antenna's detected output voltages, and the sum of the three magnetic field antenna's detected output voltages. The input channels to each of the summing amplifiers contain switches to select any or all of the three signals, for measurement of portions of, or the total magnitudes of the E-and the H-fields. By summing the squared magnitudes of the all of the vector components, the total E-field and H-field can be measured.

In the case of the digital electronic signal processing system, the multiple channel analog-to-digital converter 34 is used to provide a digital representation of each of the six detected vector(squared) field components. The digital processing sub-system 36 containing temporary data storage capabilities is then used to sum any combination of the three electric field (squared) signals and any combination of the three magnetic field (squared) signals. In addition, all six squared field components are stored individually for later analysis and use.

The final sub-systems include display 38 and recorder 44 which are used for either the analog or the digital signal processing versions of the system. They provide data display and recording functions so that the separate, instantaneous values of the electric and the magnetic field are provided for immediate viewing, and for later analysis using recorder 44.

While the invention has been described in detail above, it is to be understood that this detailed description is by way of example only, and the protection granted is to be limited only within the spirit of the invention and the scope of the following claims.

What is claimed is:

1. An isotropic, broad band, non-directional, rf electromagnetic radiation probe, comprising:
   an isotropic set of E-field antennas;
   an isotropic set of H-field antennas essentially encompassing the same volume of space as the set of E-field antennas; and
   circuit means for simultaneously meauring and displaying the sum of any of the squared vector components of both the E-field and the H-field radiation detected by said probe, said circuit means comprising switching means square law detector means associated with each antenna in each of said sets of antennas, summing means, means for feeding the outputs of said square law detectors to said summing means, display means, and means for feeding the output of said summing means to said display means.

2. A probe as set forth in claim 1, wherein said E-field antennas are dipoles each having a length equal to or less than one-tenth the wavelength of the maximum frequency to be received, and said H-field antennas are loops having diameters equal to or less than one-tenth of the wavelength of the maximum frequency to be received.

3. A probe as set forth in claim 2, further including:
   filter means for flattening the response of said antennas over a desired frequency range; and
   detection means for detecting the output signals of said filter means.

4. An isotropic, broadband, non-directional rf electromagnetic radiation probe comprising:
   a set of three mutually orthogonal E-field antennas; and
   a set of three mutually orthogonal H-field antennas located such that both sets of antennas encompass essentially the same volume of space; and
   circuit means for simultaneously measuring said displaying the sum of a selectable combination of the squared vector components of both the E-field and the H-field radiation detected by said probe, said circuit means comprising square law detector means associated with each antenna in each of said sets of antennas, summing means, means for feeding the outputs of said square law detectors to said summing means, display means, and means for feeding the output of said summing means to said display means.

5. A probe as set forth in claim 4, wherein the physical size of said antennas is small compared to the wavelength of the highest frequency to be received.

6. A probe as set forth in claim 4, wherein said E-field antennas comprise dipoles and said H-field antennas comprise loops.

7. A probe as set forth in claim 6, wherein said E-field antennas have lengths equal to or less than one-tenth the wavelength of the maximum frequency to be received by the probe.

8. A probe as set forth in claim 7, further comprising:
   first means coupled to each of said E-field antennas for flattening the response of said antennas over a desired frequency range and for detecting received signals; and
   second means coupled to each of said H-field antennas for flattening the response of said antennas over the desired frequency range and for detecting received signals.

9. A probe as set forth in claim 7, further including high-resistance leads to couple out the detected signals.

10. A probe as set forth in claim 8, wherein:
said first means comprises a high-pass RC filter and a diode detector; and
said second means comprises an RC filter and a diode detector.

11. A probe as set forth in claim 10, wherein said diode detectors are Schottky diodes.

12. A probe as set forth in claim 10, further including high-resistance leads connected to couple out the detected signals.

13. A probe as set forth in claim 1, and said circuit means comprising signal conditioning means positioned in said circuit means between the output of each of said square law detector means and said summing means.

14. A probe as set forth in claim 1, said summing means comprising both analog data processing means and digital data processing means, both arranged in said circuit means between the outputs of said square law detector means and said display means.

15. A probe as set forth in claim 14, said analog data processing means comprising a pair of summing amplifiers, means to feed the outputs of said E-field antennas to one of said summing amplifiers, and means to feed the outputs of said H-field antennas to the other of said summing amplifiers, and means to feed the outputs of said pair of summing amplifiers to said display means.

16. A probe as set forth in claim 15, and three separate manually operable switch means one associated with each of the three inputs to each of said pair of summing amplifiers.

17. A probe as set forth in claim 14, said digital data processing means comprising a multi-channel analog-to-digital converter, and data processing means arranged in said circuit between the outputs of said square law detectors and said display means.

18. A probe as set forth in claim 14, said display means including means to separately display the total E-field and the total H-field detected by said antennas.

19. A probe as set forth in claim 14, said display means including data recording means to permit recording of the electric and magnetic field data for later analysis.

20. An isotropic, broadband, non-directional, rf electromagnetic radiation probe comprising:
a set of three mutually orthogonal dipole antennas;
a set of three mutually orthogonal loop antennas essentially encompassing the same volume of space as set of dipole antennas;
a plurality of filters coupled to said dipole antennas to flatten out the response of each of said dipoles over a desired frequency range;
a plurality of filters coupled to said loop antennas to flatten the response of each of said loops over a desired frequency range;
Schottky diode detectors coupled to said filters to provide detected signals from the outputs of said filters; and
circuit means for simultaneously measuring the total electric field detected by said dipole antennas and total H-field radiation detected by said loop antennas, said circuit means comprising square law detector means associated with each antenna in each of said sets of antennas, summing means, means to read the outputs of said square law detectors to said summing means, display means, and means to feed the output of said summing means to said display means.

21. A probe as set forth in claim 20, further including high-resistance leads connected to couple out the detected signals.

22. A probe as set forth in claim 20, said summing means comprising both analog data processing means and digital data processing means, both arranged in said circuit between the outputs of said Square Law Detector means and said display means.

* * * * *

UNITED STATES PATENT AND TRADEMARK OFFICE
CERTIFICATE OF CORRECTION

PATENT NO.   :   4,588,993
DATED        :   May 13, 1986
INVENTOR(S)  :   BABIJ ET AL

It is certified that error appears in the above-identified patent and that said Letters Patent is hereby corrected as shown below:

Column 6, line 11, after "means", insert --,--;

Claim 4,   line 37, after "measuring", change "said"

to -- and --.

Signed and Sealed this

Twenty-first Day of October, 1986

[SEAL]

Attest:

DONALD J. QUIGG

Attesting Officer

Commissioner of Patents and Trademarks